United States Patent [19]

Takahashi et al.

[11] Patent Number: 4,542,085
[45] Date of Patent: Sep. 17, 1985

[54] NEGATIVE WORKING DIAZO LIGHT-SENSITIVE COMPOSITION WITH OXONOL DYE AND LITHOGRAPHIC PRINTING PLATE USING THE SAME

[75] Inventors: Hiroshi Takahashi; Akira Nishioka; Fumihiro Tokunaga, all of Shizuoka; Yoshimasa Aotani, Kanagawa; Koichiro Aono, Shizuoka, all of Japan

[73] Assignee: Fuji Photo Film Co., Ltd., Kanagawa, Japan

[21] Appl. No.: 500,601

[22] Filed: Jun. 2, 1983

[30] Foreign Application Priority Data

Jun. 2, 1982 [JP] Japan .................................. 57-94574

[51] Int. Cl.[4] .......................... G03C 1/60; G03F 7/08; G03F 7/26
[52] U.S. Cl. .................................... 430/158; 430/157; 430/175; 430/176; 430/179; 430/512; 430/522
[58] Field of Search ............... 430/175, 176, 179, 157, 430/522, 512, 302, 158

[56] References Cited

U.S. PATENT DOCUMENTS

| | | |
|---|---|---|
| 2,274,782 | 3/1942 | Gaspar ................................. 430/522 |
| 3,458,311 | 7/1969 | Alles .................................... 430/276 |
| 3,512,983 | 5/1970 | Watanabe et al. .................... 430/522 |
| 3,778,274 | 12/1973 | Inoue et al. .......................... 430/179 |
| 3,891,516 | 6/1975 | Chu ..................................... 430/302 |
| 4,126,466 | 11/1978 | Roos .................................... 430/271 |
| 4,144,067 | 3/1979 | Ruckert et al. ...................... 430/175 |

FOREIGN PATENT DOCUMENTS 1129407 10/1968 United Kingdom ............... 430/160

*Primary Examiner*—Charles L. Bowers, Jr.
*Attorney, Agent, or Firm*—Sughrue, Mion, Zinn, Macpeak, and Seas

[57] ABSTRACT

A negative working light-sensitive composition and a lithographic printing plate using the composition are described. The printing plate is comprised of a hydrophilic support and a thin layer of a negative working light-sensitive composition on the support. The light-sensitive composition contains a light-sensitive diazo compound and a compound capable of increasing absorption over the light-sensitive wavelength region of the composition with increasing exposure time.

18 Claims, 2 Drawing Figures

NEGATIVE WORKING DIAZO LIGHT-SENSITIVE COMPOSITION WITH OXONOL DYE AND LITHOGRAPHIC PRINTING PLATE USING THE SAME

FIELD OF THE INVENTION

The present invention relates to a negative working light-sensitive composition and a lithographic printing plate using the composition. More particularly, the present invention relates to a negative working light-sensitive composition containing a light-sensitive diazo resin and a lithographic printing plate comprising a hydrophilic support and a thin layer of the negative working light-sensitive composition wherein said light-sensitive composition further contains such a compound to show increased light-absorption over the light-sensitive wavelength region thereof as the exposure time increases.

BACKGROUND OF THE INVENTION

When a negative working light-sensitive lithographic printing plate comprising a hydrophilic support with a negative working light-sensitive resin composition provided thereon in a thin layer form is exposed to light through a negative transparency, a photo-chemical reaction occurs at exposed areas. The reaction causes the light-sensitive resin composition to form a net work structure or cross-linked structure, or to change the adhesive force of the light-sensitive resin composition with respect to the support. This accelerates insolubilization of the light-sensitive layer in a developer. When the light-sensitive layer is subjected to the developer, unexposed parts of the light-sensitive layer are removed, resulting in the formation of a positive image pattern on the support.

In such negative working light-sensitive printing plates, therefore, as the exposure time is increased or lengthened, the net work structure of the light-sensitive resin composition, or the adhesive force of the light-sensitive resin composition to the support is enhanced, as a result of which the stability of the image pattern at the changes of developing conditions, e.g., a change of developing time, is increased and the strength of the thus-formed image is also increased, resulting in a production of a lithographic printing plate having longer press life.

However, when the exposure time is increased to obtain such printing plates having longer press life, the image pattern tends to lose sharpness or cause so-called dot-gaining under the influences of scattering or reflection of light. This tendency becomes pronounced particularly when supports readily scattering light, such as a grained aluminum support, and a paper support are used. The tendency becomes even more pronounced when such grained aluminum supports are subjected to an anodic treatment. In order to improve characteristics such as printing performance, the thickness of the anodized layer on the support is sometimes increased. This makes the image pattern lose sharpness and in the case of half tone dot images, the resulting gaining tendency of the dot size, deteriorates tone reproduction especially in shadow areas. Thus, the entire dot image becomes dark and it becomes impossible to obtain images having the desired tone.

Various methods of preventing the half tone dot gaining in negative working light-sensitive lithographic printing plates are known, including a method in which the light-sensitive layer is made as thin as possible; a method in which the light-sensitive layer is designed so that the absorbance thereof does not drop too much during exposure, for example, dye is incorporated into the light-sensitive layer; and a method in which the support is subjected to a coloring treatment or is undercoated with dye to prevent halation of light from the support.

In connection with the method of preventing the halation of light from the support a paper master as described in British Pat. No. 1,129,407 in which a yellow colored support is used, or a light-sensitive lithographic printing plate as described in U.S. Pat. No. 3,891,516 in which a steel-gray anodized aluminum plate is used. Further, lignt-sensitive lithographic printing plate as described in U.S. Pat. No. 3,458,311 in which a support is undercoated with yellow dye, and a light-sensitive layer is provided thereon, and so forth are known. The method of decreasing light reflectivity of the support surface has many disadvantages, for example, the light-sensitive layer has a poor adhesivity to the support, the lithographic printing plate is liable to produce scum, and images obtained are indistinct due to dark color of the support.

The incorporation of dye into the light-sensitive layer is a method which has long been employed for optically uneven light-sensitive layers of silver salt emulsions in which the irradiation of light by silver halide particles occurs strongly. In accordance with this method, the resolving power and image sharpness are improved by adding dye to the light-sensitive layer. In the case of non-silver salt light-sensitive materials, an attempt to add certain ultraviolet absorbers to the light-sensitive layer so as to increase gradation and resolving power is disclosed in U.S. Pat. No. 4,144,067.

The sensitivity of the light-sensitive layer, however, is lowered and, therefore, the material is not proper for a practical use.

In the method of preventing the half tone dot gaining by reducing the thickness of the light-sensitive layer, the material having a thin light-sensitive layer is not only improved in an image reproductivity to the extent expected but also shows lower press life. In fact, it is impossible in a practical use to decrease the coating amount to 100 mg/m$^2$ or less. Therefore, the method to make a thin light-sensitive layer has a limitation in its thickness of the light-sensitive layer.

As a result of our investigation of various dyes which do not lower the sensitivity of a light-sensitive layer when added to the light-sensitive layer and which reduce the gaining of half tone dots and improve the image sharpness, the inventors have attained the present invention.

Thus, the object of the present invention is to provide a negative-working light-sensitive composition reducing the gaining of half tone dots and to improve image sharpness without lowering the light sensitivity and to provide a negative working light-sensitive lithographic printing plate having the layer comprising the above-described composition on a support.

SUMMARY OF THE INVENTION

The present invention relates to a negative working light-sensitive composition containing a compound capable of increasing absorption of at least a part of light ranging in the light-sensitive wavelength region of the composition and a negative working light-sensitive lithographic printing plate having the layer comprising the composition on a support.

DETAILED DESCRIPTION OF THE INVENTION

Figure 1:
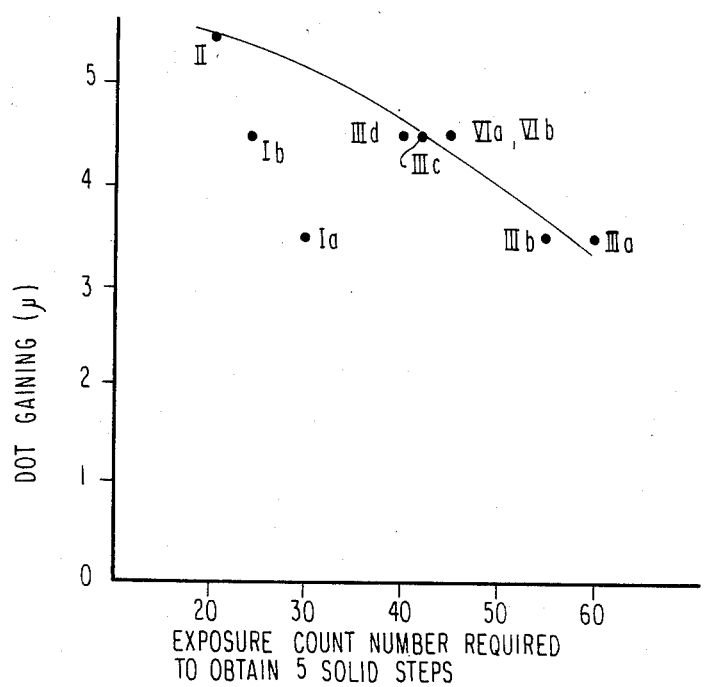
FIG. 1 is a graph showing the relation between the half tone dot gaining in size and the sensitivity of a light-sensitive composition at exposure count number to be required to obtain 5 solid steps.

The lithographic printing plate having a light-sensitive layer comprising the composition of this invention is characterized by the following. It exhibits a relatively high sensitivity because in the initial stage of the exposure process, the diazo compound in the light-sensitive layer can sufficiently absorb the light of the wavelength region. However, in the later stage of the exposure process, a dye is formed that sufficiently absorbs the light of the wavelength region in which the diazo compound is sensitive. Owing to this dye, the light scattered and reflected by the substrate are absorbed. As a result, irradiation and halation are prevented in the later steps of exposure.

Because of the above-mentioned characteristic properties, the half tone dots on the lithographic printing plate of this invention do not gain in size so much, even when a prolonged exposure is made. Thus, the lithographic printing plate of the present invention thus-obtained is superior in tone reproduction.

There is no limitation on the compound that is capable of increasing absorption of at least a part of light being in the wavelength region in which the light-sensitive composition is sensitive, as exposure proceeds. However, the preferred one is such that absorption increases for the light of the wavelength range from 350 to 450 nm, more suitably from 390 to 430 nm. Such compounds fall into two categories. The compound of the first category changes for itself into a compound that increases the absorption of the light of the above-specified wavelength range, when it is exposed to the light for image exposure. The compound of the other category reacts with a photodecomposition product of the diazo compound contained in the photopolymer composition or with a photodecomposition product of a light-sensitive substance added to the light-sensitive composition to show the increase of absorption of the light of the above-specified wavelength range. Preferable among them is one which reacts with an acidic compound resulting from photodecomposition of the diazo compound, to form a compound that increases the absorption of the light of the specific wavelength range. Such a preferred compound can be found by the following simple method.

That is, where the counter ion of the light-sensitive diazo resin is 2-methoxy-4-hydroxy-5-benzoylbenzenesulfonic acid anion, a methanol solution of 2-methoxy-4-hydroxy-5-benzoylbenzenesulfonic acid is prepared, and it has been found that a suitable compound reacts with an acid having a color changeable region at the molar concentration range of from $10^{-5}$ to $10^{-3}$ mole to produce an absorption peak at the light-sensitive wavelength region of the light-sensitive composition to which the compound is to be added. The same evaluation procedure as above is applicable when the counter ion of the light-sensitive diazo resin is different from the above-described one.

The preferable compound capable of increasing absorption used in the present invention is represented by the following general formula (I)

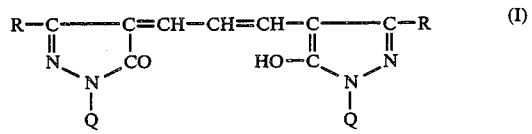

wherein R represents an alkyl group or an alkoxycarbonyl group and Q represents a hydrogen atom or an aryl group which may be substituted.

The alkyl group represented by R has 1 to 5 carbon atoms, preferably 1 to 3 and most preferably a methyl group. The alkoxycarbonyl group represented by R has 2 to 5 carbon atoms, preferably 3 to 4, and most preferably an ethoxycarbonyl group. The aryl group represented by Q is preferably a phenyl group which may be substituted by an alkyl group having 1 to 3 carbon atoms.

The compound represented by the general formula (I) is used in the light-sensitive composition in an amount of 0.5 to 10 weight %, preferably 1 to 5 weight % based on the total amount of the light-sensitive composition. The light-sensitive diazo compound is incorporated in the light-sensitive composition in an amount of 5.0 to 30 weight %, preferably 10 to 20 weight % based on the total amount of the light-sensitive composition. In the light-sensitive composition a polymeric material may be incorporated as a binder, in addition to the diazo compound and the absorption-increasing compound represented by the general formula (I). Such polymeric material is in an amount of 95 weight % or less based on the weight of the whole composition.

To the composition of the present invention may be added other ingredients such as a printing-out agent for obtaining a visible image immediately after exposure, an image colorant such as a dye and other fillers. The composition of the present invention is dissolved in a solvent capable of dissolving the above-described ingredients, such as ethylene chloride, methanol, 2-methoxyethanol, cyclohexanone, methyl ethyl ketone, ethyleneglycol monomethyl ether, toluene ethyl acetate, etc., and coated on a support.

In producing a lithographic printing plate using the light-sensitive composition of the present invention, the light-sensitive composition is coated on a support in an amount of 0.1 to 7 g/m², preferably 0.5 to 4.0 g/m².

Useful developing solutions for the light-sensitive composition of the present invention include an aqueous solution of inorganic alkali agent such as sodium silicate, potassium silicate, etc., or organic amines such as monoethanol amine or triethanol amine, etc. The organic amines are most preferable. The aqueous solution optionally contains an organic solvent, a surfactant and other additives. Of the organic solvents, a solvent having 10% by weight or less of solubility in water, such as cellosolve, phenylcellosolve, benzyl alcohol, etc., is preferred. Other additives include a wetting agent, an antifoaming agent, sodium sulfite, etc. The details of the aqueous solution are described in U.S. Pat. Nos. 3,669,660, 3,751,257 and 4,186,006; British Pat. Nos.

1,515,174 and 2,068,136; and West German patent application (OLS) No. 2,809,774.

An example having a mechanism similar to that of the present invention is a diazo light-sensitive sheet as described in British Pat. No. 1,041,463, which undergoes a color change immediately when exposed to light. In this diazo light-sensitive sheet, the light-sensitive diazo resin undergoes a photodecomposition when irradiated with active rays, forming an acidic substance in the light-sensitive layer. The acidic substance reacts with an acid-base indicator, causing the acid-base indicator to change in color. As a result, exposed areas and unexposed areas can be clearly distinguished. British Pat. No. 1,041,463 also describes that it is sufficient that a sufficient contrast at the visible region is obtained, and that the optimum color change is from colorless to a color which can be seen clearly and allows ultraviolet rays to pass therethrough, or vice versa. Furthermore, it describes that compounds having an absorption peak at the light-sensitive wavelength region may be incorporated so that they act as ultraviolet absorbers or filters, and that in this case the compounds serve to decrease the sensitivity of the light-sensitive lithographic printing plate. In British Pat. No. 1,041,463, however, there cannot be found any description concerning the addition of compounds producing an absorption peak at the light-sensitive wavelength region of the light-sensitive substance, and the effect thereof.

The indicators described in British Pat. No. 1,041,463, i.e., p-phenylazodiphenylamine, resazurin, Quinaldine Red, Methyl Orange, Bromophenol Blue, alizarin, Cresol Red, Phenol Red, Methyl Yellow, Orange IV, Eosine Yellowish, and phenolphthalein, were examined. This examination has revealed that none of the compounds increase the absorbance at the wavelength region corresponding to that of the light-sensitive diazo resin present in combination with increasing exposure time. The examples in the specification of British Pat. No. 1,041,463 were also investigated. Example 1 is directed to a positive type light-sensitive lithographic printing plate in which an aluminum support subjected to a phosphotungstic acid treatment is used. In Example 2, various acid-base indicators and the p-toluenesulfonic acid salt of a p-diazodiphenylamine/formaldehyde condensate are coated in combination on an aluminum support which has been treated with silicate. The amounts of the mixtures being coated are very small (10 to 30 mg/m$^2$) as is the case with U.S. Pat. No. 2,714,066. The light-sensitive layer is composed of a mixture consisting of a light-sensitive diazo resin and a low molecular weight compound. Thus, the diazo light-sensitive sheet of British Pat. No. 1,041,463 is of the additive type, i.e., of the type that after light-exposure and development, lacquer coating is applied to reinforce the image, which is different from the negative working light-sensitive lithographic printing plate of the invention.

The light-sensitive diazo compounds as used herein are compounds producing acidic compounds by photodecomposition, preferably compounds containing at least two diazo groups in the molecule. Suitable examples are a salt of sulfonic acid (e.g., triisopropylnaphthalenesulfonic acid, 4,4-biphenyldisulfonic acid, 5-nitroorthotoluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid, and p-toluenesulfonic acid) or a salt of inorganic acid (e.g., hexafluorophosphoric acid and tetrafluoroboric acid) of a p-diazodiphenylamine/formaldehyde or acetaldehyde condensate. Other preferred diazo compounds include the above-described acid salts of a 2,5-dimethoxy-4-p-tolylmercaptobenzenediazonium/formaldehyde or acetaldehyde, etc. Any diazo compounds capable of producing an acidic compound by a photo-reaction can be used in the invention.

A description is given below of the constituent elements of the lithographic printing plate of this invention. The substrate used for the plate is one which has a hydrophilic surface and is commonly used for lithographic printing plates. Examples of such substrates include paper; paper laminated with plastics (e.g., polyethylene, polypropylene, and polystyrene); sheet of metal such as aluminum (or aluminum alloy), zinc, iron, and copper; sheet of plastics such as cellulose diacetate, cellulose triacetate, cellulose butyrate, cellulose butyrate acetate, cellulose nitrate, polyethylene terephthalate, polyethylene, polystyrene, polypropylene, polycarbonate, and polyvinyl acetal; and plastics sheets laminated or metallized with the above-mentioned metal. Preferable among them is an aluminum sheet or a composite aluminum sheet.

The substrate undergoes surface treatment so that the surface thereof is made hydrophilic, or the substrate is provided with a hydrophilic layer. The surface treatment for plastics sheets includes chemical treatment, discharge treatment, flame treatment, UV light treatment, high frequency treatment, glow discharge treatment, plasma treatment, and laser treatment which are disclosed in U.S. Pat. Nos. 2,764,520, 3,497,407, 3,145,242, 3,376,208, 3,072,483, 3,475,193, and 3,360,448, and British Pat. No. 788,365. If necessary, a hydrophilic layer can be formed on the treated surface as disclosed in U.S. Pat. No. 2,649,373 and Japanese Laid-Open Patent Nos. 40890/1978 and 61643/1978.

A substrate having a metal surface, particularly aluminum surface, should preferably undergo sandblast graining; dipping in an aqueous solution of sodium silicate, potassium fluorozirconate, or phosphate; or anodizing. These treatments may be used in combination. For example, an aluminum plate may undergo sandblast graining and then dipping in an aqueous solution of sodium silicate. (See U.S. Pat. No. 2,714,066.) Also, an aluminum plate may be anodized and then dipped in an aqueous solution of alkali metal silicate. (See U.S. Pat. No. 3,181,461.)

The anodizing is accomplished by passing an electric current through an aluminum plate placed in an aqueous solution or non-aqueous solution of an inorganic acid such as phosphoric acid, chromic acid, sulfuric acid, and boric acid, or an organic acid such as oxalic acid and sulfamic acid, or salt thereof. They are used individually or in combination. Preferred acid is phosphoric acid or sulfuric acid or a mixture thereof.

The anodizing is also accomplished by electrodeposition of silicate as disclosed in U.S. Pat. No. 3,658,662. In addition, an aluminum plate may be anodized in sulfuric acid after electrolysis with alternating current in hydrochloric acid, as disclosed in British Pat. No. 1,208,224. Moreover, the anodized aluminum plate may be provided with a primer layer of cellulose resin containing an aqueous salt of metal such as zinc, as disclosed in U.S. Pat. No. 3,860,426. Such a plate effectively prevents scumming in the printing process.

The light-sensitive composition of this invention may further contain a binder, preferably a polymeric material, in addition to the diazo compound.

Examples of polymeric materials include polyamide, polyether, polyester, polycarbonate, polystyrene, polyurethane, polyvinyl chloride and copolymer thereof, polyvinyl butyral, polyvinyl formal, shellac, epoxy resin, phenolic resin, and acrylic resin. Preferred examples are copolymers of the following monomers (1) to (13).

(1) N-(4-hydroxyphenyl)acrylamide, N-(4-hydroxyphenyl)methacrylamide, and N-(4-hydroxynaphthyl)methacrylamide.

(2) o-, m-, or p-hydroxystyrene.

(3) o-, m-, or p-hydroxyphenylmethacrylate.

(4) Unsaturated carboxylic acid such as acrylic acid, methacrylic acid, maleic anhydride, and itaconic acid.

(5) Alkyl acrylate such as methyl acrylate, ethyl acrylate, propyl acrylate, butyl acrylate, amyl acrylate, hexyl acrylate, octyl acrylate, 2-chloroethyl acrylate, 2-hydroxyethyl acrylate, glycidyl acrylate, and N-dimethylaminoethyl acrylate.

(6) Alkyl methacrylate such as methyl methacrylate, ethyl methacrylate, propyl methacrylate, butyl methacrylate, amyl methacrylate, cyclohexyl methacrylate, 2-hydroxyethyl methacrylate, 4-hydroxybutyl methacrylate, glycidyl methacrylate, N-dimethylaminoethyl methacrylate, and benzyl methacrylate.

(7) Acrylamides and methacrylamides such as acrylamide, methacrylamide, N-methylolacrylamide, N-methylolmethacrylamide, N-ethylacrylamide, N-hexylmethacrylamide, N-cyclohexylamide, N-hydroxyethylacrylamide, N-phenylacrylamide, N-nitrophenylacrylamide, and N-ethyl-N-phenylacrylamide.

(8) Ethyl vinyl ether, 2-chloroethyl vinyl ether, hydroxyethyl vinyl ether, propyl vinyl ether, octyl vinyl ether, and phenyl vinyl ether.

(9) Vinyl esters such as vinyl acetate, vinylchloroacetate, vinyl butyrate, and vinyl benzoate.

(10) Styrenes such as styrene, α-methylstyrene, methyl styrene, and chloromethyl styrene.

(11) Vinyl ketones such as methyl vinyl ketone, ethyl vinyl ketone, propyl vinyl ketone, and phenyl vinyl ketone.

(12) Olefins such as ethylene, propylene, isobutylene, butadiene, and isoprene.

(13) N-vinylpyrrolidone, N-vinylcarbazole, 4-vinylpyridine, acrylonitrile, and methacrylonitrile.

The above-mentioned monomers may be copolymerized with other monomers. This invention covers copolymers of the above-mentioned monomers which are further modified with glycidyl methacrylate or glycidyl acrylate. However, this invention is not limited to them.

The binder used in this invention is incorporated into the light-sensitive composition in an amount of about 50 to 99.5 wt %, preferably about 55 to 95 wt %.

The following examples and comparative examples are given to illustrate the invention in greater detail. However, ths scope of the invention is not limited to these examples.

EXAMPLE 1

A 0.24 mm thick aluminum plate was grained using a nylon brush and a 400 mesh aqueous suspension of Pamiston, and then fully washed with water. The aluminum plate was then etched by immersing it in a 10% aqueous sodium hydroxide solution at 70° C. for 60 seconds, washed with flowing water, neutralized with 20% nitric acid, and thereafter, subjected to an electrolytic coarsening treatment according to the method described in Japanese Patent Application (OPI) No. 67507/78 (the term "OPI" as used herein refers to a "published unexamined Japanese patent application"), i.e., in a 1% aqueous nitric acid solution using a sine wave alternating wave form electric current ($V_A$=12.7 V, $V_C$=9.1 V) at a quantity of electricity of 160 coulomb/dm². Subsequently, the aluminum plate was desmatted at 55° C. for 2 minutes by immersing it in a 30% aqueous sulfuric acid solution, and then, was subjected to an anodizing treatment in a 7% aqueous sulfuric acid solution in such a manner that the thickness of the anodized layer was 2.0 g/m².

Each of Dyes II, Ia and Ib as shown in Table was added to a light-sensitive solution having the formulation as described hereinafter in an amount of 0.03 g. The resulting mixture was then coated on the above-treated aluminum plate and dried at 80° C. for 2 minutes to provide a light-sensitive layer. In all the thus-produced light-sensitive lithographic printing Plates II, Ia and Ib, the coating amount of the light-sensitive layer was 2.0 g/m².

| Composition of Light-Sensitive Solution | |
|---|---|
| 2-Hydroxyethyl methacrylate copolymer (prepared from 23% by weight of 2-hydroxyethyl methacrylate, 27% by weight of acrylonitrile, 45% by weight of methyl methacrylate, and 5.0% by weight of methacrylic acid according to the method described in Example 1 of British Patent 1,505,709) | 0.70 g |
| 2-Methoxy-4-hydroxy-5-benzoylbenzenesulfonic acid salt of p-diazodiphenylamine/formaldehyde condensate | 0.10 g |
| 2-Methoxyethanol | 6.00 g |
| Methanol | 6.00 g |
| Ethylenedichloride | 6.00 g |

The thus-produced light-sensitive lithographic printing plates II, Ia and Ib were exposed imagewise at the respective exposure count numbers shown in Table 1 by means of nuArc FT26V ZUDNS ULTRA-PLUS FLIP-FLOP PLATE MAKER (manufactured by nuArc Co.). Each light-sensitive lithographic printing plate was then developed at a liquid temperature of 25° C. for 50 seconds in an automatic developing machine Model 800S manufactured by Fuji Photo Film Co., Ltd., which had been charged with a developer, whereby there was obtained a printing plate. In any case, the 5th step of a step tablet (manufactured by Fuji Photo Film Co., Ltd.) which has been printed simultaneously with imagewise exposure was solid. Under such conditions, the size of the half tone dots on the plate relative to the negative original was examined, and the results are shown in Table 1. Printed matters obtained using the printing plates Ia and Ib had a particularly light feeling and were sharp compared with those printed matters obtained using the printing plate II.

EXAMPLE 2

To the same light-sensitive solution as used in Example 1, except that the hexafluorophosphoric acid salt of a p-diazodiphenylamine/formaldehyde condensate was used as a light-sensitive diazo resin, were added Dyes II, Ia and Ib to prepare three light-sensitive solutions.

These light-sensitive solutions were each coated on the same support as used in Example 1 in the same manner as in Example 1 to produce light-sensitive lithographic printing plates II-F, Ia-F and Ib-F. The thus-produced light-sensitive lithographic printing plates were processed under the same conditions as in Example 1 to produce lithographic printing plates.

With these lithographic printing plates, there were obtained the same results as in Example 1 except that staining occurred somewhat easily compared with the plates of Example 1 under certain conditions. This is due to the addition of Dyes II, Ia and Ib to the light-sensitive layer. That is, with the lithographic printing plates, the sizes of the dots on the plates relative to the negative original when exposure was performed so that the 5th step of a step tablet (manufactured by Fuji Photo Film Co., Ltd.) printed simultaneously with imagewise exposure was solid were $5.5\mu$, $3.5\mu$, and $4.5\mu$, respectively. Printing plates Ia-F and Ib-F provided printed matters which had a light feeling and were sharp compared with those produced by printing plate II-F.

COMPARATIVE EXAMPLE 1

Dyes IIIa, IIIb, IIIc and IIId shown in Table 2 were each added to the same light-sensitive solution as used in Example 1 in an amount of 0.03 g based on the weight of the solution to prepare light-sensitive solutions. These light-sensitive solutions were each coated on the same support as used in Example 1 in the same manner as in Example 1 to produce light-sensitive lithographic printing plates IIIa, IIIb, IIIc and IIId. The thus-produced light-sensitive lithographic printing plates were processed in the same manner as in Example 1 to produce lithographic printing plates.

With these lithographic printing plates, the fatnesses of dots on the plates relative to the original were as shown in Table 2. Thus, it can be seen that the addition of Dyes IIIa, IIIb, IIIc and IIId to the light-sensitive layer produces the effect of preventing an increase in the size of dots, i.e., prevents blurring.

However, compared with the light-sensitive lithographic printing plates II, Ia and Ib of Example 1, a serious drop in sensitivity occurred. Furthermore, the exposure count numbers required for obtaining the 5 solid steps were 2 or 3 times those for the light-sensitive lithographic printing plates II, Ia and Ib of Example 1.

COMPARATIVE EXAMPLE 2

Blue Dyes VIa and VIb shown in Table 3 were each added to the same light-sensitive solution as used in Example 1 in an amount of 0.03 g based on the weight of the light-sensitive solution to prepare light-sensitive solutions. These light-sensitive solutions were each coated on the same support as used in Example 1 in the same manner as in Example 1 to produce light-sensitive lithographic printing plates VIa and VIb. The thus-produced light-sensitive lithographic printing plates were processed in the same manner as in Example 1 to produce lithographic printing plates.

With the lithographic printing plates, the gaining of dots on the plates relative to the original were as shown in Table 3. The addition of the dyes to the light-sensitive layer caused a serious drop in sensitivity. However, the effect of preventing any gaining in dot size was higher by only about $1\mu$ than the lithographic printing plate II of Example 1.

COMPARATIVE EXAMPLE 3

Red Dye V shown in Table 4 was added to the same light-sensitive solution as used in Example 1 in an amount of 0.03 g based on the weight of the light-sensitive solution to prepare a light-sensitive solution. This light-sensitive solution was then coated on the same support as used in Example 1 in the same manner as in Example 1 to produce a light-sensitive lithographic printing plate. The thus-produced light-sensitive lithographic printing plate was processed under the same conditions as in Example 1 to produce a lithographic printing plate.

With the thus-produced lithographic printing plate, the dot gaining relative to the original was $4.0\mu$.

COMPARATIVE EXAMPLE 4

The same light-sensitive solution as used in Example 1 containing Dye II was coated on the same support as used in Example 1 in a dry coating amount of $1.0 \text{ g/m}^2$. The thus-produced light-sensitive lithographic printing plate was processed under the same conditions as in Example 1 to produce a lithographic printing plate.

With the thus-produced lithographic printing plate, the image gaining was $4.3\mu$, which is low compared with that of the light-sensitive lithographic printing plate of Example 1.

TABLE 1

| Dye | Name | Structure | Exposure* Count | Gaining** ($\mu$) |
|---|---|---|---|---|
| II | Oil Blue #601*** | Triphenylmethane Dye | 20 | 5.5 |
| I | | $R-C{=}C-C{=}CH-CH{=}CH-C{=}C-R$ with N, CO, HO-C, N, Q substituents | | |
| Ia | | R: $-CO_2C_2H_5$  Q: phenyl | 30 | 3.5 |
| Ib | | R: $-CH_3$  Q: $-H$ | 24 | 4.5 |

*Number of counts required for obtaining 5th step by means of nuArc FT26V 2UDNS ULTRA-PLUS FLIP-TOP PLATE MAKER (made by nuArc Company)
**Dot gaining relative to the original film at a degree of printing of 5th step
***Produced by Orient Kagaku Kogyo Co., Ltd.

TABLE 2

| Dye | Name | Structure | Exposure* Count | Gaining** ($\mu$) |
|---|---|---|---|---|
| IIIa | Benzeneazo-phenylamine | C6H5—N=N—C6H4—NH—C6H5 | 60 | 3.5 |
| IIIb | Chrysoidine MC crystal | C6H5—N=N—C6H3(NH2)(NH2·HCl) | 55 | 3.5 |
| IIIc | | (bis-oxazinone methine dye with OC2H5 groups, φ-N substituents) | 42 | 4.5 |
| IIId | | CH3-C=C(-CH=C6H4-N(CH3)2)-C(=O)-N(N=)-C6H4-SO3K (pyrazolone dye) | 40 | 4.5 |

Note:
*, **Same as in Table 1.

TABLE 3

| Dye | Name | Structure | Exposure* Count | Gaining** ($\mu$) |
|---|---|---|---|---|
| VI | | R—C=C—CH=CH—CH=CH—CH=C—C—R with N—N, CO, HO—C, Q substituents | | |
| VIa | | R: —CO2C2H5   Q: —C6H5 | 45 | 4.5 |
| VIb | | R: —CO2CH3   Q: —C6H5 | 45 | 4.5 |

Note:
*, **Same as in Table 1.

TABLE 4

| Dye | Name | Structure | Exposure* Count | Gaining** ($\mu$) |
|---|---|---|---|---|
| V | | (see structure below) | 45 | 4.0 |

Structure of Dye V:

$$C_2H_5OCO-C(=N-N(CH_2CH_2CN)-C=O)-C=CH-CH=CH-C(=C(OH)-N(CH_2CH_2CN)-N=)-C-COOC_2H_5$$

Note:
*, **Same as in Table 1.

Dyes Ia, Ib, IIIa, IIIb, IIIc and IIId as described in Examples 1 and 2, and Comparative Example 1 are dyes of from yellow to red, and their absorption peaks and the light-sensitive wavelength region of the light-sensitive diazo resin overlap partially or largely. Thus, they were expected to have the effect of preventing gaining of the dot. In fact, as shown in Examples 1 and 2, and Comparative Example 1, they have been found to have the effect of preventing image gaining.

Each dye was added to a light-sensitive composition as described in Example 1 and the resulting mixture was used to produce a light-sensitive lithographic printing plate. The relation between gaining of the image formed in the light-sensitive lithographic printing plate and the sensitivity (the number of exposure counts required for producing a 5 stage rush print) was determined and is shown in FIG. 1.

As apparent from FIG. 1, Dye II having no absorption peak within the light-sensitive wavelength region of the light-sensitive diazo resin has the highest sensitivity, but gaining of dot resulting therefrom is largest. On the other hand, Dyes IIIa, IIIb, IIIc and IIId as described in Comparative Example 1 have the effect of preventing an increase in dot size since they have an absorption peak within the light-sensitive wavelength region of the light-sensitive diazo resin. However, it has been found that the addition of Dyes IIIa, IIIb, IIIc and IIId to the light-sensitive layer results in a serious reduction in sensitivity although there is an increased effect with respect to preventing dot gaining. It has further been found that when Dyes Ia and Ib as described in Example 1 are added, even though the number of exposure counts required for producing a 5 solid steps is small, i.e., a reduction in sensitivity is low, the effect of preventing image gaining is great.

As a result of extensive investigations to determine the mechanism, it has been found that dyes represented by the general formula (I) have the following feature: that is, when p-toluenesulfonic acid is added to a methanol solution of each of Dyes I, when the concentration of p-toluenesulfonic acid reaches $10^{-4}$ mole/l, Dyes I each shows absorption within the region of from 380 to 500 nm. It has also been found that although Compound V as described in Comparative Example 3, which is similar to Dyes Ia and Ib, exhibits the same behavior, the absorption peak is markedly small compared with that resulting from the use of an equal amount of Dye Ia or Ib. Dye IIIa undergoes a change in color on addition of p-toluenesulfonic acid. However, with Dye IIIa, the absorption peak appearing near 400 nm disappears on addition of p-toluenesulfonic acid.

Figure 2:
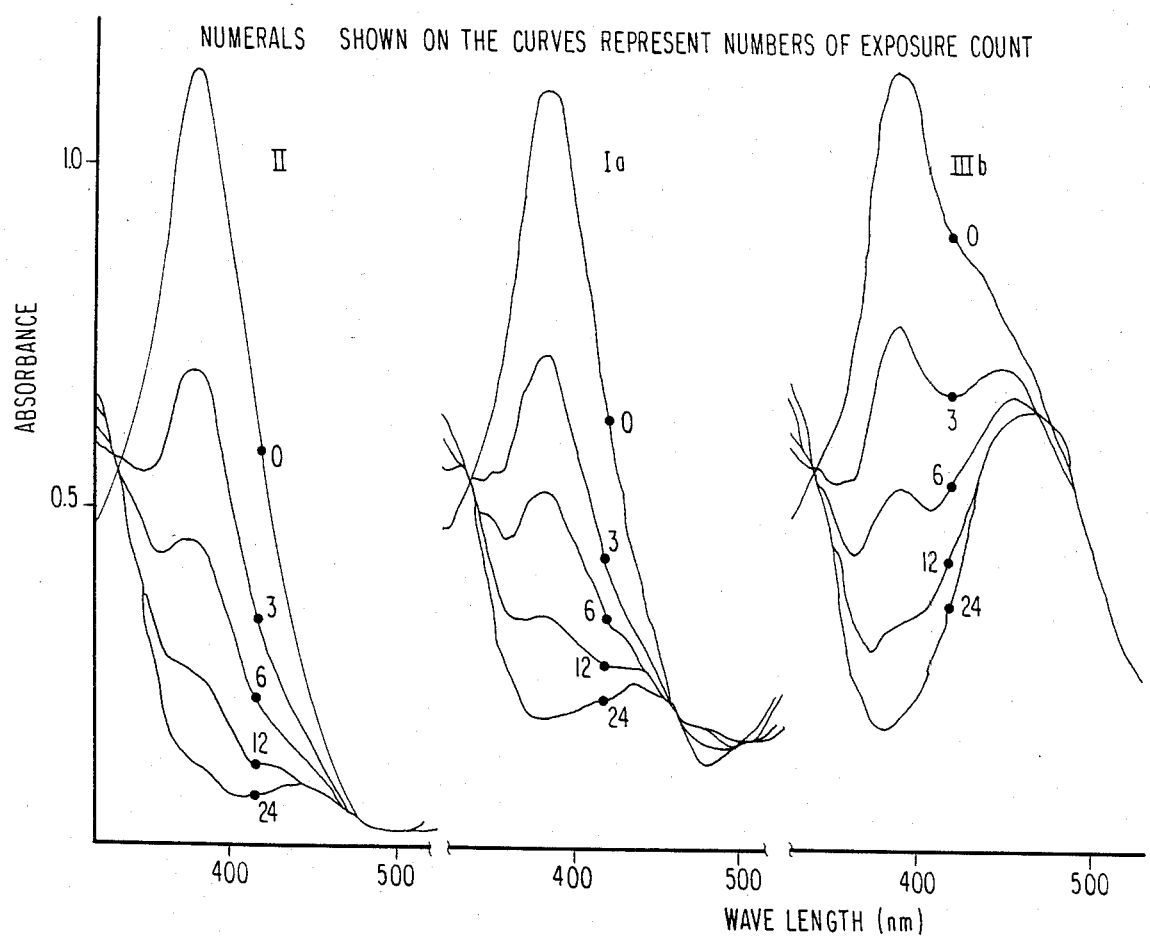
FIG. 2 are ultraviolet absorption spectra change of light-sensitive layers containing Dye II, Ia or IIIb, during exposure said light-sensitive layer being provided on a transparent polyethylene terephthalate base.

A light-sensitive composition containing each of the above-described dyes was coated on a transparent polyethylene terephthalate base in the same coating amount as in the production of the light-sensitive lithographic printing plate, exposed to light for the predetermined number of counts, and thereafter, changes in spectrum were observed. As shown in FIG. 2, in the case of Dye II having no absorption peak near the light-sensitive wavelength region (350 to 450 nm), as the exposure time is increased, the absorbance of the light-sensitive layer decreases abruptly. With Dye Ia, it has been found that a new absorption peak appears near 425 nm, the absorbance does not fall to less than 0.2, and therefore, that even at the end point of exposure, 40% of incident light is always absorbed in the light-sensitive layer. Thus, it can be seen that when such a light-sensitive layer is coated on a support, scattering of light from the support is reduced, and gaining of dot is prevented. The same tendency was observed for Dye Ib. On the other hand, when other dyes, e.g., Dye IIIb, are added, there exists from the beginning a big peak at the shoulder portion of the light-sensitive wavelength region, and the sensitivity drops seriously. The formation of a new peak as observed in Dye Ia was not observed. In addition, Blue Dyes VIa and VIb (described in Comparative Example 2), which are similar to Dye Ia, were examined in the same manner as above. In this case, however, since a new absorption peak appeared near a relatively long wavelength region (near 500 nm), the desired effects could not be obtained.

It is, however, very difficult to discover compounds which are applicable to the present invention. For example, even in the case of Dye V which produces a new absorption peak at the same acidity as for Dye Ia, the absorbance is too low and it has an absorption peak near 400 nm from the beginning. Thus, Dye V is not suitable for practical use. In this case, the counter ion of the light-sensitive diazo resin is 2-methoxy-4-hydroxy-5-benzoylbenzenesulfonic acid anion. It is considered, therefore, that the type of the compound producing a new absorption peak in the presence of acids varies slightly depending on the type of the diazo counter ion, such as hexafluorophosphoric acid anion and sulfonic acid anion, the acidity of the counter ion, the amount of the acidic substance formed by a photoreaction, and so forth. That is, in the present invention, compounds producing a new absorption peak in the presence of acids are required to undergo a color variation proportional to the change in acidity of the light-sensitive resin composition to which the compounds are to be added, said acidity being changed by exposure. Furthermore, it is necessary that the absorption peak newly produced by the color change and the absorption peak of the light-sensitive layer overlap, and that the absorption is above a certain level, preferably more than 0.1 absorbance.

While the invention has been described in detail and with reference to specific embodiments thereof, it will be apparent to one skilled in the art that various changes and modifications can be made therein without departing from the spirit and scope thereof.

What is claimed is:

1. A negative working light-sensitive composition comprising an admixture of (a) a light-sensitive diazo compound which contains at least two diazo groups and produces an acidic compound by photo-decomposition, and present in an amount sufficient to form an image after actinic exposure and development and (b) a compound capable of increasing absorption of at least a part of light ranging in the light-sensitive wavelength region of the composition with increasing exposure time, and present in an amount sufficient for increasing said absorption with increasing exposure time, said compound capable of increasing absorption being presented by the following general formula (I)

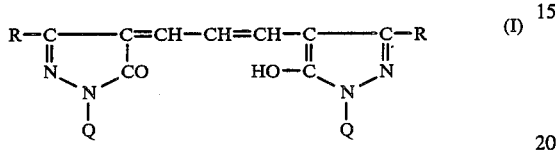

wherein R represents an alkyl group or an alkoxycarbonyl group and Q represents a hydrogen atom or an aryl group or a substituted aryl group, and wherein the light-sensitive wavelength region of the composition is within the wavelength region 350 to 450 nm and compound (b) is one such that it is capable of increasing absorption for the light of the wavelength range from 350 to 450 nm.

2. A negative working light-sensitive composition as claimed in claim 1, wherein the composition is further comprised of a polymeric material.

3. A negative working light-sensitive composition as claimed in claim 1, wherein said compound (b) is one which reacts with a photodecomposition product of the diazo compound.

4. A negative working light-sensitive composition according to claim 1, wherein compound (b) is one which produces a new absorption peak in the presence of an acid and undergoes a color variation proportional to the change in acidity of the light-sensitive composition upon exposure, with the absorption peak newly produced by the color change and the absorption peak of the light-sensitive diazo compound overlapping, and with the absorption of the light-sensitive composition being more than 0.1 absorbance during exposure.

5. A negative working light-sensitive composition according to claim 1, wherein the absorbance does not fall to less than 0.2 during exposure so that even at the end point of the exposure 40% of incident light is absorbed in the light-sensitive composition.

6. A negative working light-sensitive composition as claimed in claim 1, wherein the alkyl group represented by R has 1 to 5 carbon atoms, the alkoxy group represented by R has 2 to 5 carbon atoms, and the aryl group represented by Q is a phenyl group or a phenyl group substituted by an alkyl group having 1 to 3 carbon atoms.

7. A negative working light-sensitive composition as claimed in claim 1, wherein R is ethoxycarbonyl or methoxycarbonyl and Q is phenyl.

8. A negative working light-sensitive composition as claimed in claim 1, wherein compound (b) is one such that it is capable of increasing absorption for the light of the wavelength range from 390 to 430.

9. A negative working light-sensitive lithographic printing plate, comprising:
a hydrophilic support having coated thereon:
a negative working light-sensitive layer comprising
a negative working light-sensitive composition comprising:
 (a) a light-sensitive diazo compound which contains at least two diazo groups and produces an acidic compound by photodecomposition and present in an amount sufficient to form an image after active exposure and development; and
 (b) a compound capable of increasing absorption of at least part of a light ranging in the light-sensitive wavelength region of the composition with increasing exposure time, and present in an amount sufficient for increasing said absorption with increasing exposure time, said compound capable of increasing absorption being represented by the following general formula (I)

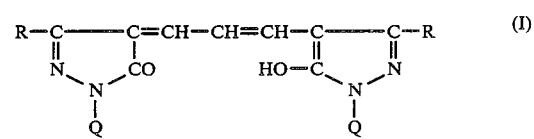

wherein R represents an alkyl group or an alkoxycarbonyl group and Q represents a hydrogen atom or an aryl group or a substituted aryl group, and wherein the light-sensitive wavelength region of the composition is within the wavelength region 350 to 450 nm and compound (b) is one such that it is capable of increasing absorption for the light of the wavelength range from 350 to 450 nm.

10. A negative working light-sensitive lithographic printing plate as claimed in claim 9, wherein the negative working light-sensitive composition is further comprised of a polymeric material.

11. A negative working light-sensitive lithographic printing plate as claimed in claim 9, wherein the light-sensitive composition is present on the support in an amount of 0.1 to 7 g/m$^2$.

12. A negative working light-sensitive lithographic printing plate as claimed in claim 9, wherein the aluminum plate has a surface subjected to treatment by means selected from the group consisting of mechanical treatment, electrochemical treatment and a combination of mechanical and electrochemical treatment and further anodized.

13. A negative working light-sensitive plate as claimed in claim 9, wherein said compound (b) is one which reacts with a photodecomposition product of the diazo compound.

14. A negative working light-sensitive plate according to claim 9, wherein compound (b) is one which produces a new absorption peak in the presence of an acid and undergoes a color variation proportional to the change in acidity of the light-sensitive composition upon exposure, with the absorption peak newly produced by the color change and the absorption peak of the light-sensitive diazo compound overlapping, and with the absorption of the light-sensitive composition being more than 0.1 absorbance during exposure.

15. A negative working light-sensitive plate according to claim 9, wherein the absorbance does not fall to less than 0.2 during exposure so that even at the end point of exposure 40% of incident light is absorbed in the light-sensitive composition.

16. A negative working light-sensitive plate as claimed in claim 9, wherein the alkyl group represented by R has 1 to 5 carbon atoms, the alkoxy carbonyl group represented by Q is a phenyl group or a phenyl group substituted by an alkyl group having 1 to 3 carbon atoms.

17. A negative working light-sensitive plate as claimed in claim 9, wherein R is ethoxycarbonyl or methoxycarbonyl and Q is phenyl.

18. A negative working light-sensitive plate as claimed in claim 9, wherein compound (b) is one such that it is capable of increasing absorption for the light of wavelength range from 390 to 430 nm.

* * * * *